United States Patent [19]
Nakayama et al.

[11] Patent Number: 5,544,117
[45] Date of Patent: Aug. 6, 1996

[54] NON-VOLATILE SEMICONDUCTOR MEMORY DEVICE WITH IMPROVED COLLECTIVE ERASING OPERATION

[75] Inventors: Takeshi Nakayama; Yasushi Terada; Kazuo Kobayashi; Masanori Hayashikoshi; Yoshikazu Miyawaki, all of Hyogo-ken, Japan

[73] Assignee: Mitsubishi Denki Kabushiki Kaisha, Tokyo, Japan

[21] Appl. No.: 670,543

[22] Filed: Mar. 15, 1991

[30] Foreign Application Priority Data

May 18, 1990 [JP] Japan .................................. 2-129991

[51] Int. Cl.$^6$ .......................... G11C 7/00; G11C 11/34; G11C 8/00
[52] U.S. Cl. ................. 365/185.22; 365/189.09; 365/185.33; 365/185.19; 365/185.11
[58] Field of Search ...................... 365/184, 185, 365/189.01, 189.07, 200, 218, 230.03, 900; 357/23.5, 23.12

[56] References Cited

U.S. PATENT DOCUMENTS 4,336,603  6/1982  Kotecha et al. ...................... 365/185
4,763,305  8/1988  Kuo ........................................ 365/200
4,890,259  12/1989  Simko .............................. 365/189.01
4,979,005  12/1990  Mitchell ................................ 365/184
5,053,990  10/1991  Kreifels et al. .................... 365/189.07

Primary Examiner—David C. Nelms
Assistant Examiner—Trong Phan
Attorney, Agent, or Firm—Lowe, Price, LeBlanc & Becker

[57] ABSTRACT

A non-volatile semiconductor memory device according to the present invention comprises a plurality of memory cells including floating gates, an injecting device for injecting electrons to the floating gate of each of the memory cells, a removing device for removing electrons from the floating gate of each of the memory cells, an erasure instructing device for instructing erasing operation, and a controlling device responsive to an instruction output from the erasure instructing device for controlling the injecting device such that electrons are simultaneously injected to all the floating gates of the memory cells which are to be erased before the removing operation by the removing device.

26 Claims, 13 Drawing Sheets

NON-VOLATILE SEMICONDUCTOR MEMORY DEVICE WITH IMPROVED COLLECTIVE ERASING OPERATION

BACKGROUND OF THE INVENTION

1. Field of the Invention

The present invention relates to a non-volatile semiconductor memory device and, more specifically, to an electrically rewritable and collectively erasable non-volatile semiconductor memory device (FLASH EEPROM).

2. Description of the Background Art

FIG. 8 is a block diagram of a conventional FLASH EEPROM which is one of non-volatile semiconductor memory devices.

A non-volatile semiconductor memory device means a memory device in which the stored content is not erased even if power supply is turned of. The non-volatile semiconductor memory devices comprise electrically erasable EPROMs and EEPROMs (electrically erasable PROM). In the EPROMs, an ultraviolet ray, a x-ray or the like is used to erase data. In the EEPROMs, erasing and rewriting of data are carried out electrically. The EEPROMs comprise normal type EEPROMs and flash type EEPROMs.

In the normal type EEPROM, a selecting transistor is provided in each memory cell and it is adapted such that when the data is read, the data stored in the memory cell does not appear on the corresponding bit line until the selecting transistor is turned on.

Referring to the figure, the non-volatile semiconductor memory device comprises an address buffer 7 to which addresses of memory cells for storage are inputted; a column decoder 8 to which column addresses are inputted; a row decoder 9 to which row addresses are inputted; a high voltage switch 10 for switching potential on word lines; an I/O buffer 11 for inputting/outputting data; a sense amplifier/write driver 12 for amplifying read data or for holding write data; a Y gate 13 for selecting a prescribed bit line; a memory cell array 14 having memory cells arranged in a matrix; a high voltage control circuit 19 for controlling the high voltage to be applied to the memory cell array 14; a control signal buffer 20 to which control signals are inputted; a control circuit 21 for controlling various operations; and an array source switch 22 for switching potential of the source of the memory cell array. A structure of a memory cell is shown in the memory cell array 14 as a representative. A memory cell 18 is arranged at an intersection of a bit line 15 and a word line 16. The drain of the memory cell 18 is connected to the bit line 15. The source of the memory cell 18 is connected to a source line 17, and the other end of the source line is connected to the array source switch 22. The word line 16 is connected to the floating gate of the memory cell 18.

The operation of the non-volatile semiconductor memory device structured as above will be described.

The operation of the non-volatile semiconductor memory device includes writing, erasing and reading operations.

Before writing, information stored in the memory cells of all addresses must be erased.

First, writing operation will be described.

The address data of an address to which writing should be done is inputted through the address buffer 7, and a control signal for enabling writing is inputted through the control signal buffer 20. Then a high voltage $V_{pp}$ is applied to the high voltage control circuit 19. The inputted address data is decoded by the row decoder 9 and correspondingly a word line is selected. The inputted high voltage $V_{pp}$ is controlled by the high voltage control circuit 19 to be applied to the high voltage switch 10.

The high voltage switch 10 of the selected word line sets the selected word line at a high voltage, and the high voltage switches of other non-selected word lines output 0 V. Meanwhile, the data inputted through the I/O buffer 11 is latched by the write driver 12. The write driver 12 applies a high voltage to the bit line including the bits to which the information "0" is to be written, and applies the potential of 0 V to the bit lines including bits to which the information "1" is to be written, through the Y gate 13 selected by the column decoder 8. At this time, the potential of the source line is maintained at 0 V by the array source switch 22 switched based on the signal outputted from the control circuit 21.

The schematic structure of the memory cell 18 will be described with reference to FIG. 10.

Two impurity regions are formed spaced apart by a prescribed distance on a main surface of a semiconductor substrate 5, one of which serves as the drain 3, and the other one serves as the source 4. An insulating film 6 is formed on that region of the semiconductor substrate 5 which is sandwiched by the drain 3 and the source 4, and floating gate 2 is formed thereon. A control electrode 1 is formed above the floating gate 2, with an insulating material 6a located therebetween. In this structure, in a memory cell to which the information "0" is written, the high voltage $V_{pp}$ is applied to the control gate 1, that is, the word line 16, a write voltage $V_{BR}$ is applied to the drain 3, that is, the bit line 15, and the potential 0 V is applied to the source 4, that is, the source line 14. Therefore, in this state, an avalanche breakdown occurs near the drain 3 of the memory cell, generating hot electrons. The hot electrons accelerated by the high voltage on the control gate 1 go over the barrier of the oxide film 6 to enter the floating gate 2, where the hot electrons are stored. By the writing operation, the threshold voltage of the memory transistor having the information "0" written therein becomes higher than before the writing operation. Namely, even if the supply voltage $V_{CC}$ (5 V) is applied to the control gate 1, the transistor is not turned ON.

Meanwhile, in the memory cell having the information "1" written therein, the potential of the bit line 15 is 0 V, and hot electrons are not generated. Therefore, the state is the same as that before writing. Namely, this state is the erased state with low threshold voltage.

The erasing operation will be described.

The erasing operation includes two operations, that is, writing of the information "0" to all addresses, and collective erasing of the memory cells of all addresses.

The reason why writing of the information "0" to all addresses is necessary will be described with reference to FIGS. 12A and 12B.

FIG. 12A shows a change of the threshold voltage of a memory transistor when writing and erasing are carried out in a conventional device, and FIG. 12B shows the change of the threshold voltage of the memory transistor when writing of the information "0" of all addresses is omitted in the erasing operation on a conventional device.

In the collective erasing operation, the potential of 0 V is applied on the control gate 1 of the memory cell, the drain 3 is kept at a floating state, and a high voltage is applied to the source 4. In this voltage condition, a high electric field is generated between the source 4 and the floating gate 2. By the high electric field, the electrons included in the control gate 2 are removed to the source 4, and as a result, the threshold voltage of the memory transistor is lowered. However, if this erasing operation is done when the original threshold voltage is low (when the information "1" has been written), the threshold voltage of the memory cell which has the information "1" written therein becomes a negative value, as shown in FIG. 12B, causing troubles in reading information.

FIG. 11 shows the change of the threshold voltage describing such trouble.

Referring to the Figure, the abscissa represents the erasing time, and the ordinate represents the threshold voltage of the memory transistor. It shows the change of the threshold voltage of a memory transistor $M_0$ in which information "0" is written, and the change of the threshold voltage of a memory transistor $M_1$ in which information "1" is written.

As the erasing time passes, the threshold voltages of both memory transistors decrease gradually. At the time T when the threshold voltage of the memory transistor $M_0$ reaches the threshold voltage V of the memory transistor $M_1$ before erasing thus completing erasing, the threshold voltage of the memory transistor $M_1$ has come to be a negative value.

FIG. 9 is a schematic diagram showing structures of some memory cells on the matrix, arranged in the memory cell 14 of FIG. 8.

Referring to the figure, memory cells $M_{11}$ to $M_{44}$ are arranged at intersections of word lines $W_1$ to $W_4$ and bit lines $B_1$ to $B_4$. The sources of the memory cells are connected to the source lines $S_1$ to $S_4$, respectively. The above mentioned troubles in reading will be described with reference to the structure of FIG. 9.

In reading operation of this device, the supply voltage $V_{CC}$ is applied to the word line, that is, the control gate 1 of the selected memory cell, and the potential 0 V is applied to the word lines of other non-selected memory cells. Whether or not the memory transistor of the selected memory cell is turned ON or not, that is, whether current flows to the bit line or not is detected. For example, referring to FIG. 9, let us assume that the memory cell $M_{22}$ is the selected memory cell, and the memory cell $M_{42}$ has its threshold value lower than the normal state by the collective erasing operation described above.

In this case, the word line $W_2$ is selected and the supply voltage $V_{CC}$ is applied. However, the word line $W_4$ is not selected, so that the potential thereof is kept at 0 V. If the information "0" has been written in the memory cell $M_{22}$, the memory transistor is not turned on even when the word line $W_2$ is selected, that is, no current flows through the bit line $B_2$. However, if the threshold voltage of the memory cell $M_{42}$ is a negative value, the memory transistor is turned ON even if the word line $W_4$ is not selected. As a result, a current flows through the bit line $B_2$ connected to the memory transistor $M_{42}$, resulting in misdetermination that the information "1" is written in the memory transistor $M_{22}$. In this manner, if any of the memory cells connected to the bit lines has a negative threshold voltage value, current flows to the bit line even if the memory cell is not selected. Accordingly, the correct information of the selected memory cell can not be read.

Such a problem is inherent to the flash type EEPROM and does not arise in the normal type EEPROM as described above. The reason for this is that each memory cell has a selecting transistor in the normal type EEPROM. Therefore, even if the threshold voltage of one memory cell attains negative, current does not flow to the bit line unless the selecting transistor of that memory cell is turned ON, and therefore, reading from other memory cells are not affected.

In addition, such a problem does not arise in the EPROM. Since erasing of data in the EPROM is carried out by irradiation of a ultraviolet ray or the like, excessive removal of electrons as described above does not occur.

In order to solve the above described problem, writing of the information "0" is carried out on memory cells of all addresses before the collective erasing operation of the memory cells, as shown in FIG. 12A. Namely, the threshold voltages of all memory cells are once set to high threshold value and thereafter collective erasing is done. Consequently, the erased memory cells have the positive threshold voltages lower than the supply potential $V_{CC}$, resulting in high reliability. The operation of writing the information "0" to the memory cells of all addresses is done in the same manner as usual, namely, the information "0" is successfully written to all addresses.

The collective erasing operation will be described.

The collective erasing is started by applying a high voltage to the high voltage control circuit 19 and by inputting a control signal enabling the collective erasing to the control signal buffer 20. The inputted high voltage is controlled by the high voltage control circuit 19 to be applied to the array source switch 22. The array source switch 22 receives the control signal from the control circuit 21, that is, the signal to start erasing, and outputs a high voltage to the source line 17. At this time, all of the word lines 16 in the memory cell array 14 have the potential 0 V, and all of the bit lines 15 are kept in the floating state. Referring to FIG. 9, all the memory cells have their sources 4 set at a high voltage, the control gates 1 set at 0 V, and drains 3 kept in the floating state. Consequently, a high electric field is generated between the floating gate 1 and the source 4 of the memory transistor, the electrons in the floating gate 2 move to the source 4 by the tunnel phenomenon, and therefore the threshold voltage of the memory transistor becomes lower than before the erasing operation.

The reading operation will be described.

In the reading operation, the address data designating the address of the memory cell holding the information to be read is written to the address buffer 7. One word line of the memory cell array 14 is selected by the same operation as the writing operation, and a prescribed bit line 15 is selected by the Y gate 13 based on the information decoded by the column decoder 8. Only the selected word line is set to the supply voltage $V_{CC}$ and the potential of other word lines is 0 V. The sense amplifier 12 connected to the selected bit line 15 detects whether the memory transistor connected to the selected word line is in ON state (low threshold voltage) or in OFF state (high threshold voltage). If it is in ON state, the information "1" is externally outputted, and if it is in OFF state, the information "0" is externally outputted, through the I/O buffer 11.

In the above described conventional non-volatile semiconductor memory device, writing of the information "0" must be carried out on the memory cells of all addresses when erasing operation is to be done. FIG. 13 is a flow chart showing the contents of the erasing operation, and FIG. 14 shows changes of potentials on the word line, bit line and source line in respective ones of the writing to the reading operations.

As shown in FIG. 13, when the erasing operation is started, whether or not the information stored in the memory cells of all addresses is "0" is determined in the step S11. If the information is not 0 in all the memory cells, the address to be written is incremented by 1 in the step S13, and the information "0" is written in the step S15. Then whether or not the address to be written is the last address is determined in the step S17. If it is not the last address, the program returns to the step S13 to repeat the writing of the information "0", and this operation is continued until the address reaches the last address. If it reached the last address and the information "0" is written in the memory cells of all addresses, erasing operation to set the information in all the memory cells to "1" is done in the step S19. Whether or not all the memory cells have the information "1" is determined in the step S21. This operation is repeated until all the memory cells have the information "1", that is, all the memory cells are set in the erased state. The erasing operation is completed when all the memory cells have the information Referring to FIG. 14, writing operation is done at first to the memory cell of the selected address under the potential condition as shown in the figure. Then, when the erasing operation is started, the information "0" is written to the memory cells of all the addresses in succession by the same manner as the normal writing operation. Namely, the state of the potentials on the word line, bit line and source line are the same when the information "0" is written in the normal writing operation and in the writing operation of the erasing operation. In the collective erasing operation, only the source line is set at the high voltage $V_{PP}$. The potential of the word line and the bit line is 0 V. In the reading operation, the word line is at the supply voltage $V_{CC}$, the bit line is at the read potential $V_{BR}$ and the source line is at 0V.

Now, as the capacity of the memory device is increased, the time required for writing the information "0" to the memory cells of all addresses in the above described erasing operation becomes very long. For example, in a FLASH EEPROM of 1 megabyte, the time required for writing "0" to all addresses is 1 to 2 seconds. The long time required for the writing of all addresses leads to long time for the erasing operation, which is inconvenient for the user.

Further, writing of information "0" to the memory cells of all addresses is carried out by using hot electrons as described above, so that the power consumption is as large as about 1 mA per 1 memory cell.

SUMMARY OF THE INVENTION

An object of the present invention is to improve reliability in a non-volatile semiconductor memory device.

Another object of the present invention is to improve reliability in erasing operation of a non-volatile semiconductor memory device.

A further object of the present invention is to reduce time required for the erasing operation in a non-volatile semiconductor memory device.

A still further object of the present invention is to decrease current required for the erasing operation in a non-volatile semiconductor memory device.

A still further object of the present invention is to increase reliability while maintaining high degree of integration, in a non-volatile semiconductor memory device.

The above described objects are attained by a non-volatile semiconductor memory device of the present invention which comprises, in an aspect, a plurality of memory cells each including a floating gate; injecting means for injecting electrons to the floating gate of each of the memory cells; removing means for removing electrons from the floating gate of each of the memory cells; erasure instructing means for instructing erasing operation; and control means for controlling the injecting means such that electrons are simultaneously injected to all of the floating gates of the memory cells which are to be erased before removing operation of the removing means in response to the instruction output from the erasure instructing means.

In another aspect, the non-volatile semiconductor memory device of the present invention comprises, to attain the above described objects: a plurality of memory cells arranged in a matrix of rows and columns, each having a control gate, a floating gate, a source and a drain for storing information based on the amounts of electrons included in the said floating gate; a plurality of bit lines each provided corresponding to the row of memory cells, connected to the drain of each of the corresponding memory cells; a plurality of gate lines each provided corresponding to a column of the memory cells connected to the control gate of each of the corresponding memory cells; writing means for selecting one of the word lines by applying a potential, for selecting one of the bit lines by setting the same to a prescribed potential and for setting the amount of electrons included in the floating gate of the memory cell corresponding to the intersection between the selected word line and bit line to a prescribed state; erasing means for removing electrons included in the floating gate of each of the memory cells by setting all of the word line to non-selected state and applying a prescribed potential to the source of each of the memory cells; instructing means for instructing the erasing operation; and control means for controlling the writing means for injecting the electrons simultaneously to all of the floating gates of the memory cells which are to be erased before the erasing operation of the erasing means in response to the instruction output from the instructing means.

In the non-volatile semiconductor memory device structured as described above, electrons are simultaneously injected to the floating gates of all the memory cells before the collective erasing operation, so that the time required for erasure can be reduced, the threshold voltages of the respective memory cells are the same after the erasing operation, thereby increasing reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
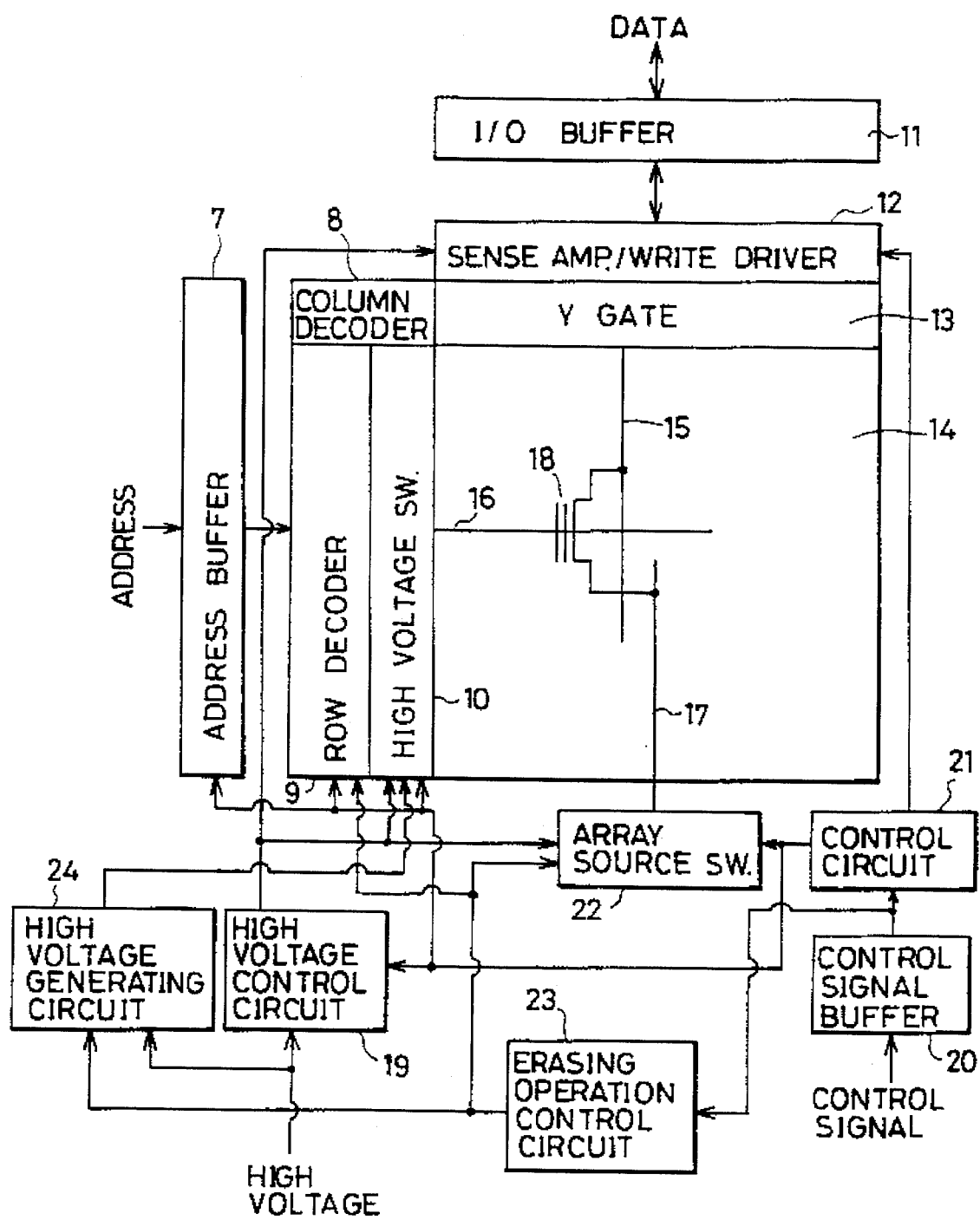
FIG. 1 is a block diagram of a non-volatile semiconductor memory device in accordance with one embodiment of the present invention.
Figure 2:
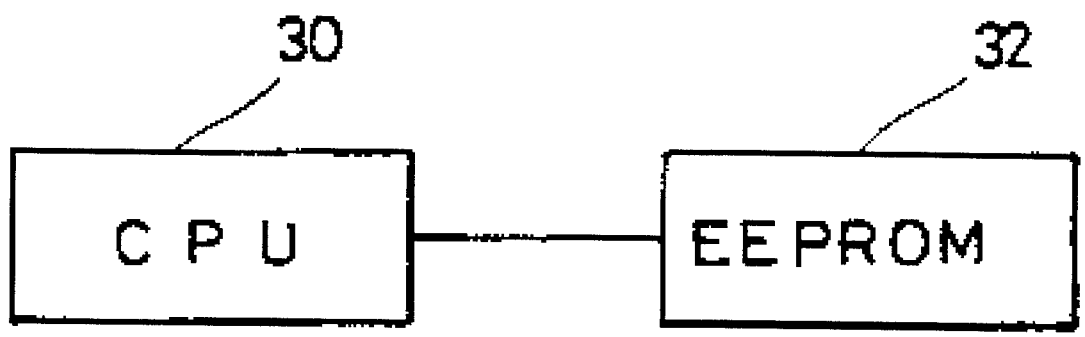
FIG. 2 shows the memory device of FIG. 1 with an external CPU connected thereto.

FIG. 1 is a block diagram of a non-volatile semiconductor memory device (EEPROM) in accordance with one embodiment of the present invention, and FIG. 2 shows connection between the EEPROM of FIG. 1 and a CPU 30 applying control signals thereto.

Peripheral structure of the memory cell array 14 is basically the same as that of the conventional non-volatile semiconductor memory device shown in FIG. 8, and therefore different points will be mainly described in the following.

Figure 8:
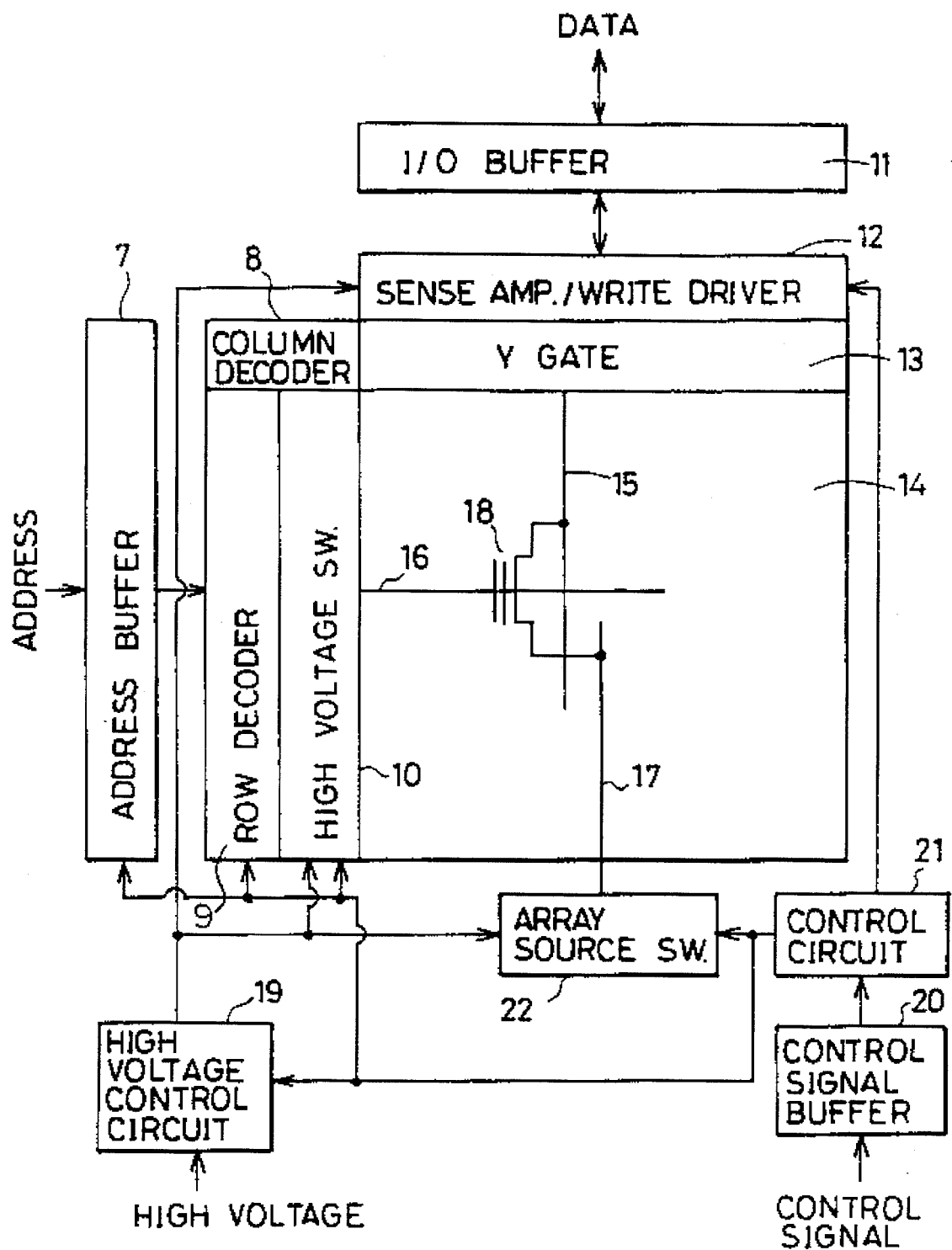
FIG. 8 is a block diagram of a conventional non-volatile semiconductor memory device.
Figure 9:
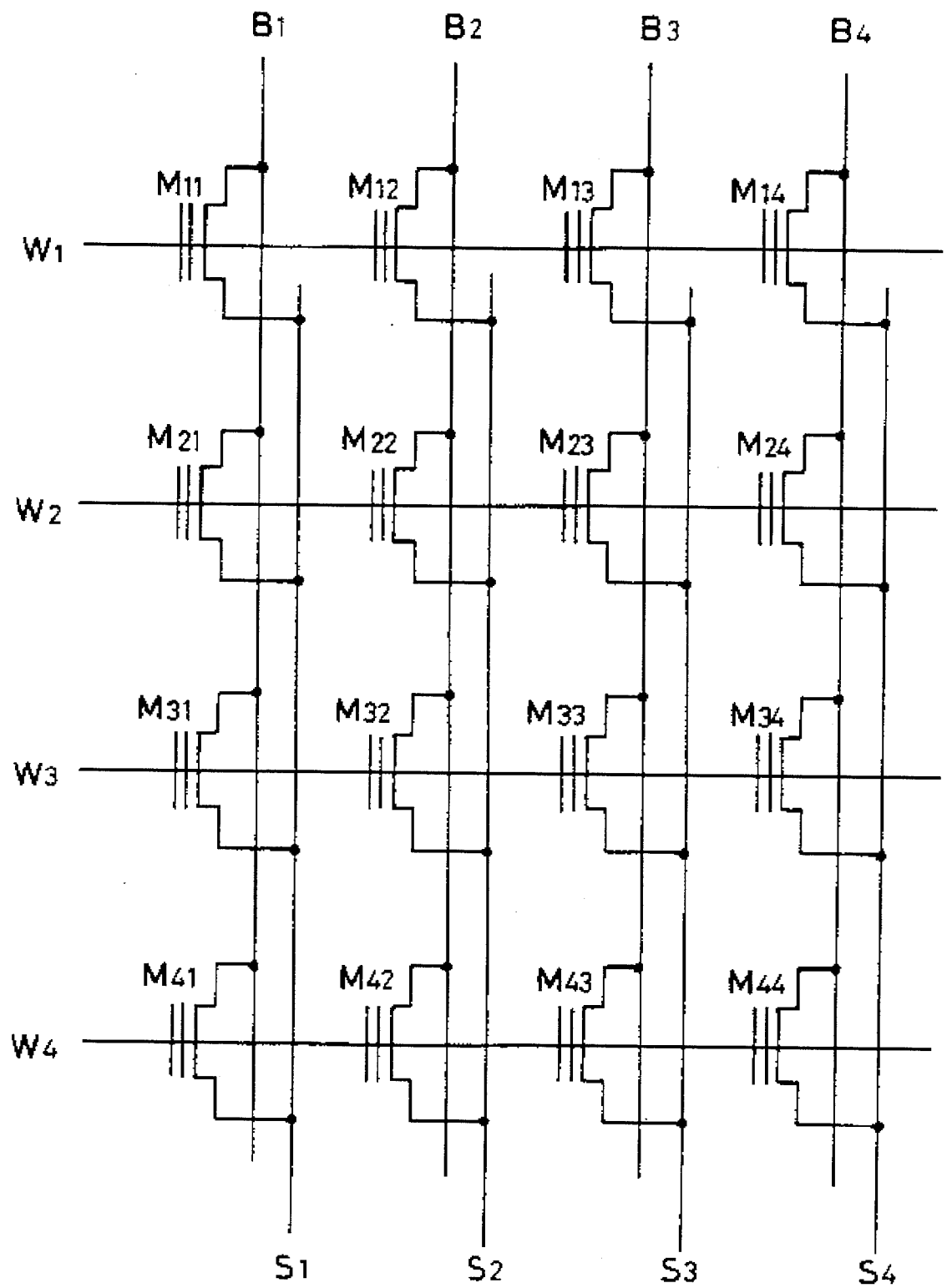
FIG. 9 shows specific layout of memory cells of the memory cell array of FIG. 8.
Figure 10:
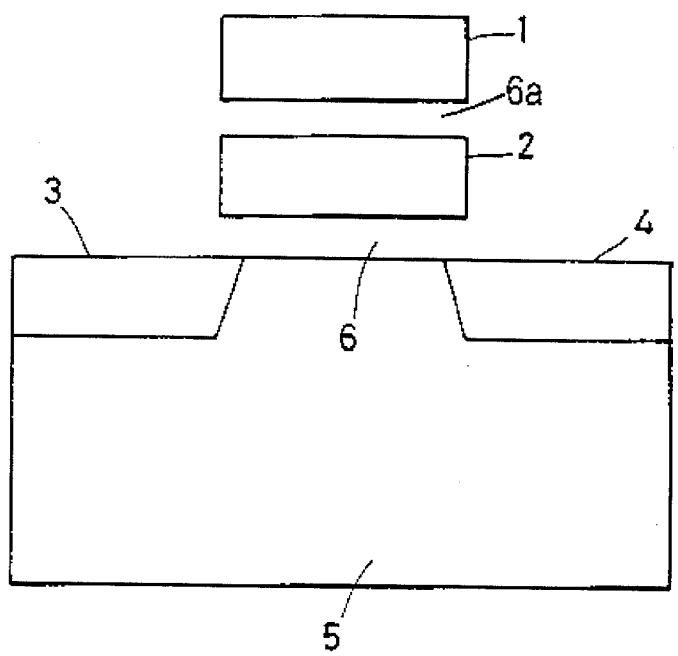
FIG. 10 shows specific structure of the memory cells of FIG. 8.
Figure 11:
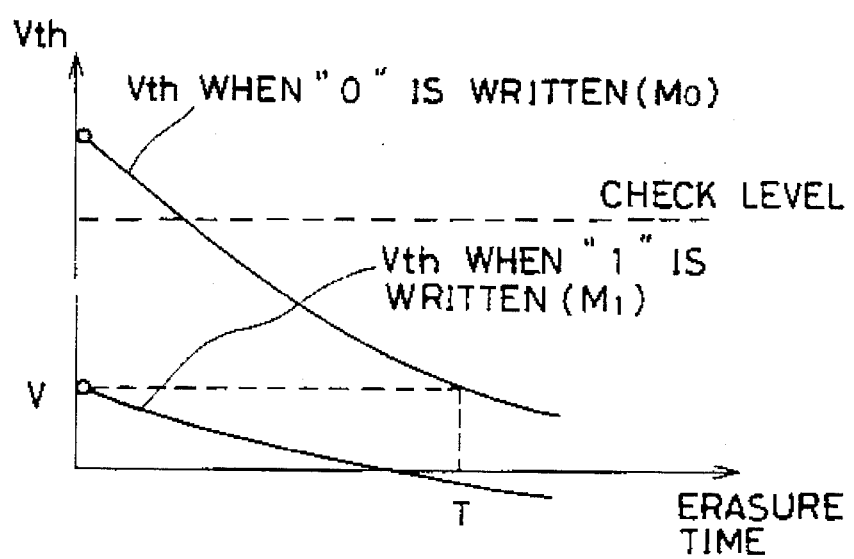
FIG. 11 shows change of threshold voltage of memory transistors as time of erasure passes.
Figure 12A:
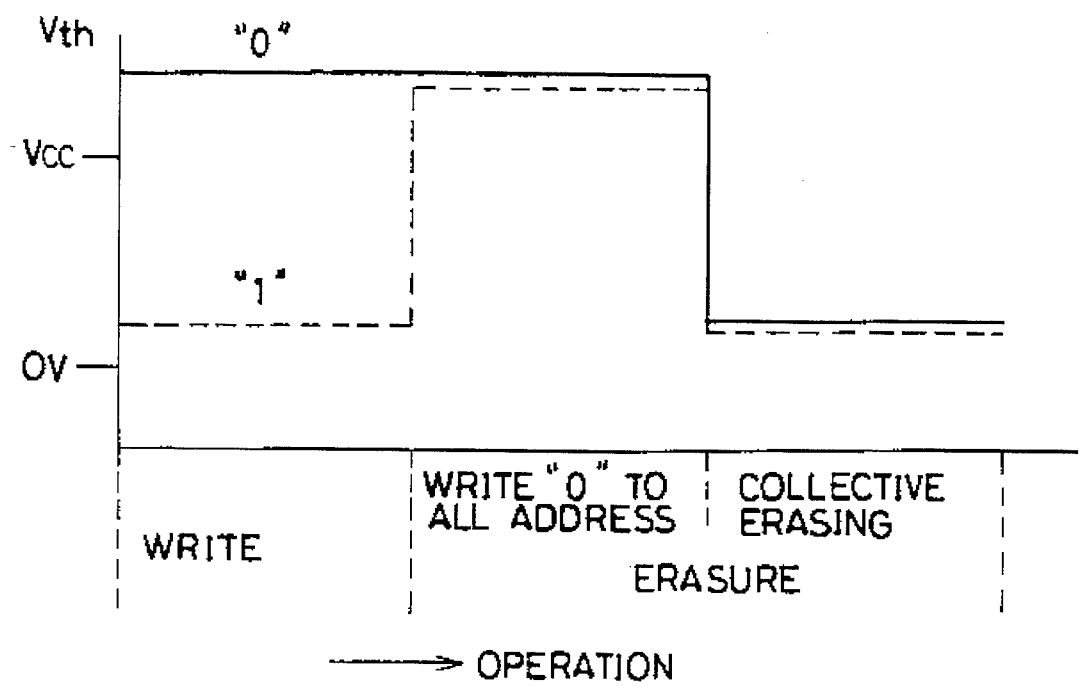
FIG. 12A shows a change in the threshold voltage of the memory transistor when the operation is switched from writing operation to the erasing operation in the memory cell of FIG. 8.
Figure 12B:
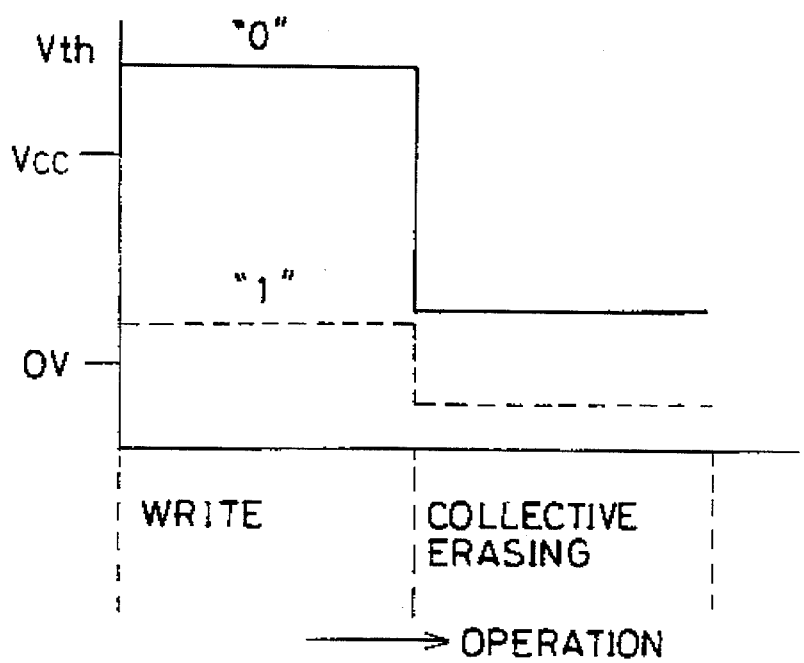
FIG. 12B shows a change in the threshold voltage of the memory transistor when collective erasing is carried out after the writing operation in the device of FIG. 8.
Figure 13:
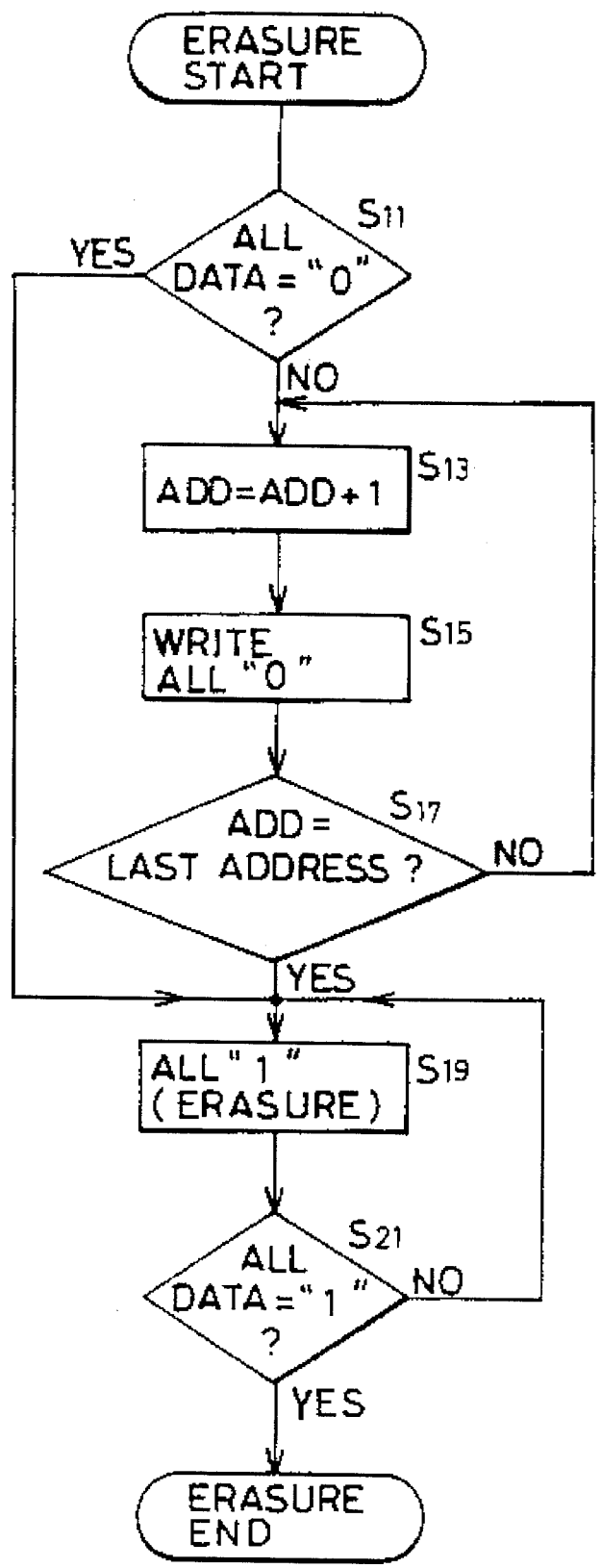
FIG. 13 is a flow chart showing the erasing operation corresponding to FIG. 12A.
Figure 14:
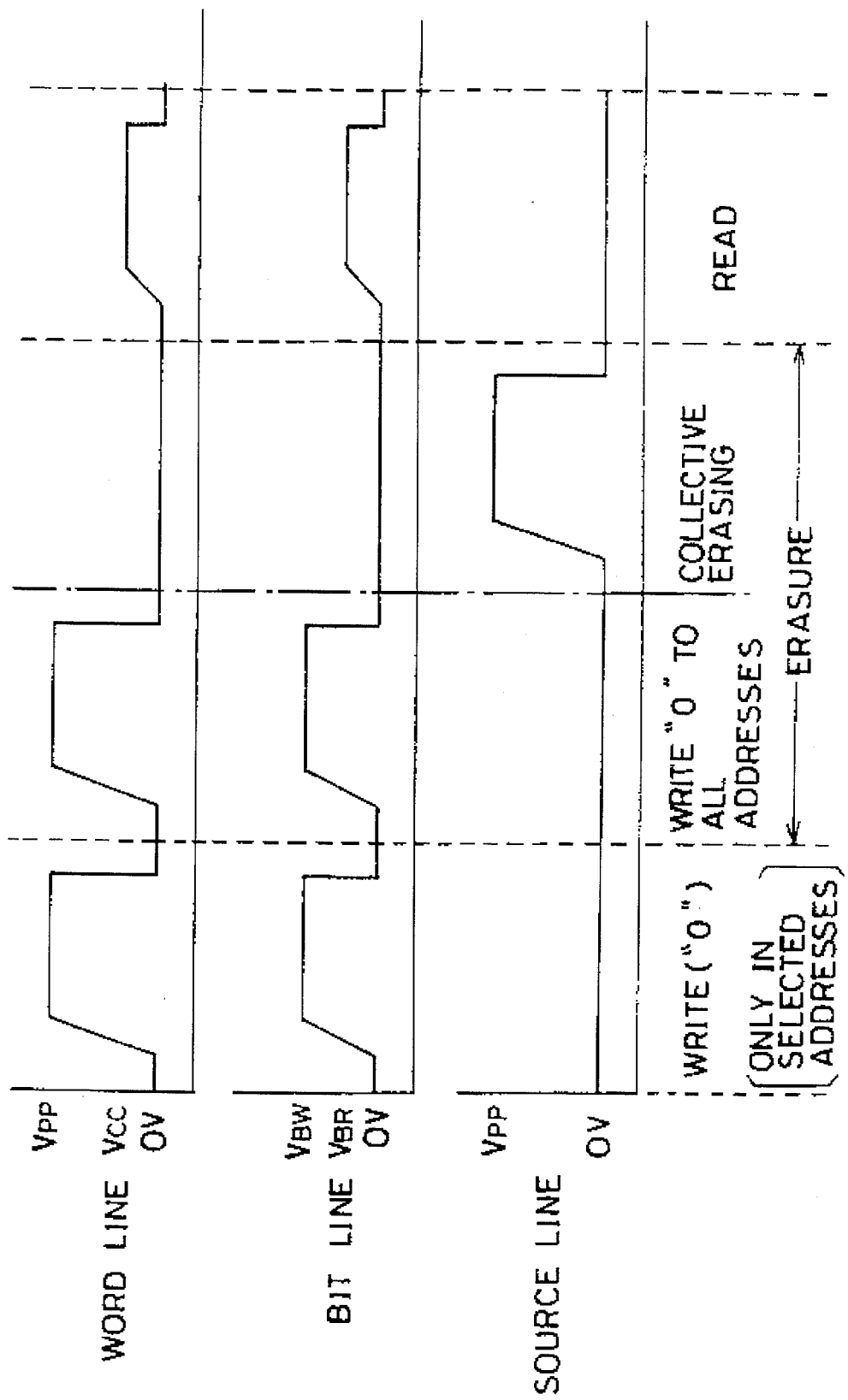
FIG. 14 shows potential states of the word line, bit line and source line in various operations of the device of FIG. 8.

Different from the conventional example of FIG. 8, an erasing operation control circuit 23 receiving signals from a control signal buffer 20 and a high voltage generating circuit 24 receiving control signals from the erasing operation control circuit 23 and a high voltage $V_{pp}$ are newly provided. The erasing operation control circuit 23 is formed by, e.g. a synchronous logic circuit. The outputs from the erasing operation control circuit 23 are also outputted to the array source switch 22 and to the row decoder 9. The outputs from the high voltage generating circuit 24 are outputted to a high voltage switch 10.

The operation of the non-volatile semiconductor memory device will be described.

Since the writing and reading operations are the same as in the conventional example, the description is not repeated. The erasing operation will be described.

Figure 3:
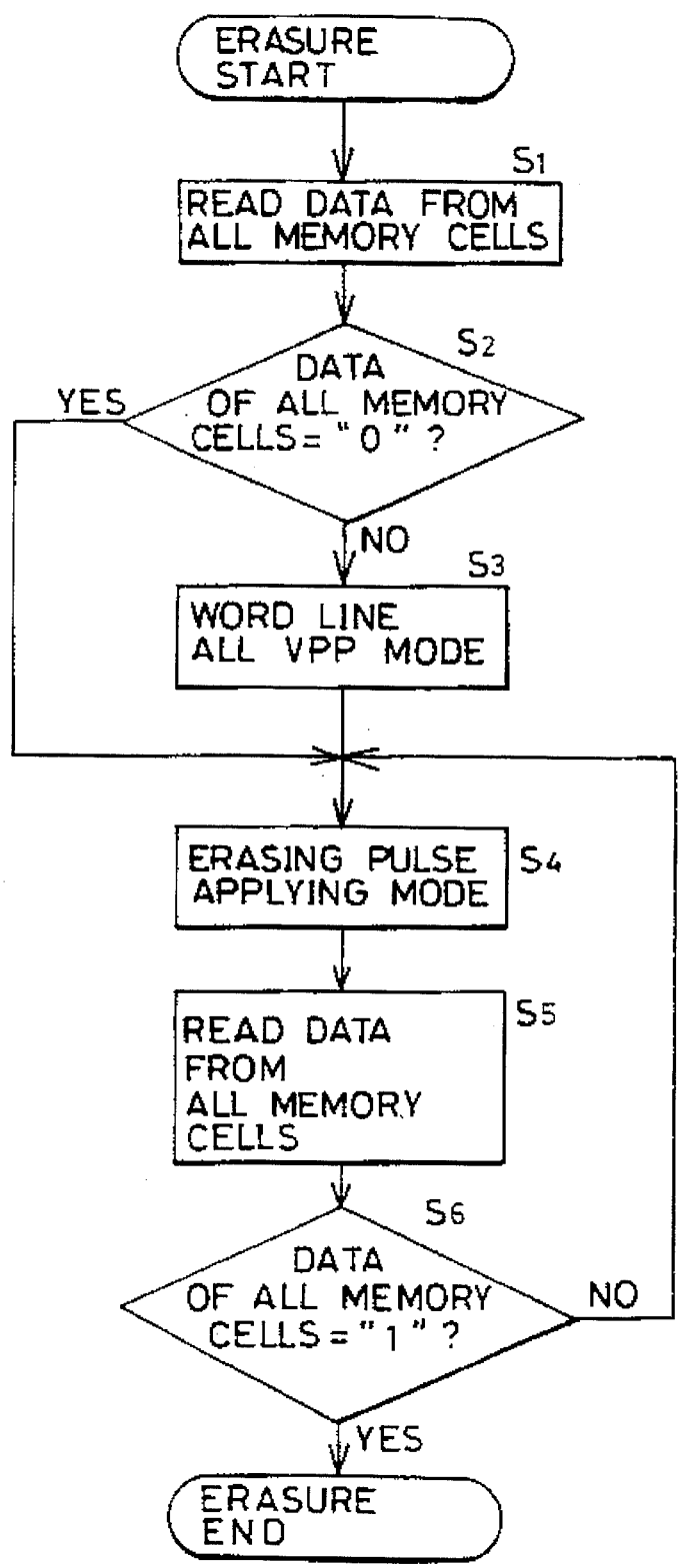
FIG. 3 is a flow chart showing the erasing operation of the memory device shown in FIG. 1.

FIG. 3 is a flow chart showing the flow of the erasing operation, which is controlled by control signals applied from the external CPU30 to the control signal buffer 20.

Figure 4:
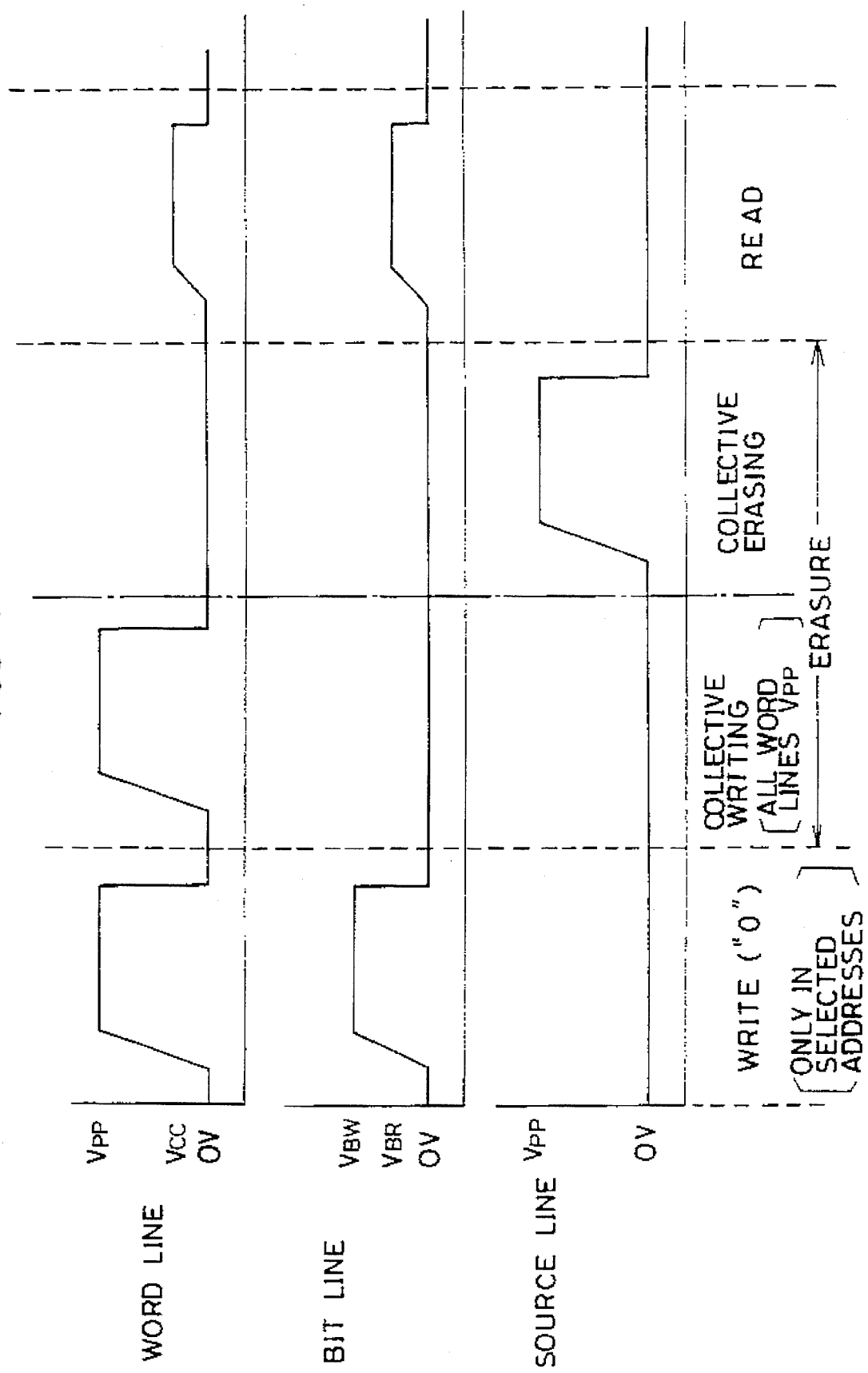
FIG. 4 shows potential states of the word line, bit line and source line in various operations of the memory device of FIG. 1.

At the start of the erasing operation, the data of the memory cells of all addresses are read in the step S1. If not all of the data are "0" (NO in step 2), writing of the information "0" to the memory cells of all addresses is carried out in the step S3. Namely, entering word line all $V_{PP}$ mode, the erasing operation control circuit 23 activates all row decoders based on the control signal applied from the control signal buffer 20, so as to select all word lines in the memory cell array 14. Meanwhile, potentials of all the bit lines and source lines in the memory cell array 14 are set to 0 V. The high voltage generating circuit 24 to which the high voltage $V_{PP}$ is inputted applies the high voltage to the high voltage switch 10 in response to the output from the erasing operation, control circuit 23, whereby all the high voltage switches 10 output high voltages to all word lines 16. More specifically, as shown in the collective writing operation of FIG. 4, under this voltage applying condition, a high voltage (12 V+α) is applied to the control gates of all memory cells, and the potential of 0 V is applied to the drains and sources. Under this condition, high electric field is generated between the floating gates and drains of all the memory cells, and electrons are injected to the floating gates by the tunnel phenomenon. By this operation, the threshold values of memory transistors of all memory cells are set to a high threshold value.

Then, erasing pulse applying mode is started in the step S4. More specifically, the erasing operation control circuit 23 inactivates all row decoders 9 based on a signal applied through the control signal buffer 20 so as to set all word lines to the non-selected state. All bit lines are set to the floating state, and the array source switch 22 is activated. By this activated array source switch 22, a high voltage is applied to all the source lines, and the information "0" which has been written in all the memory cells are erased as in the conventional example. Then data of the memory cells of all addresses are read in the step S5, and the erasing operation is repeated until data of all memory cells are set to "1" (S6). Thus the erasing operation is thus completed in this embodiment. The operation for setting all the word lines to the high voltage and the period in which the high voltage is applied in the collective erasing operation described above are controlled by a timer contained in the erasing operation control circuit 23.

Figure 5:
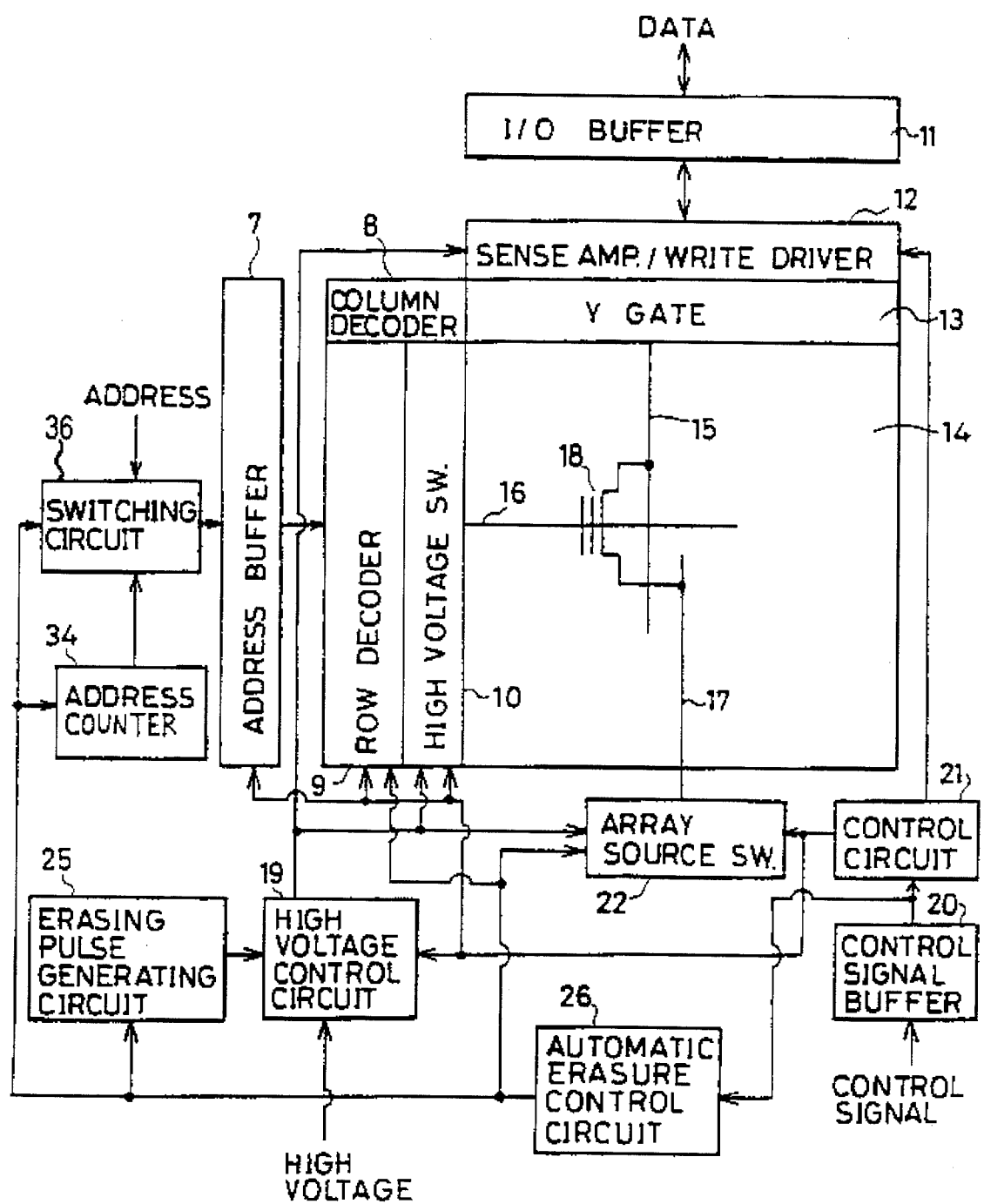
FIG. 5 is a block diagram of a non-volatile semiconductor memory device in accordance with another embodiment of the present invention.

FIG. 5 is a block diagram of a non-volatile semiconductor memory device in accordance with another embodiment of the present invention.

In the above embodiment, writing of the information "0" to all the memory cells in the erasing operation is controlled by an external CPU. In the present embodiment, the writing operation is based on internal control in the memory device.

Different from the above embodiment, an automatic control circuit 26 is provided in place of the erasing operation control circuit of the above embodiment, and an erasing pulse generating circuit 25 is provided in place of the high voltage generating circuit 24 in this embodiment. Further, an address counter 34 for generating addresses for erasing operation, and a switching circuit 36 for switching externally applied addresses and addresses outputted from the address counter 34 to input the same to the address buffer 7 are provided.

The automatic erasing control circuit 26 controls an automatic erasing mode. The erasing pulse generating circuit 25 outputs erasing pulses of a determined pulse width when the automatic erasing mode is started.

Figure 6:
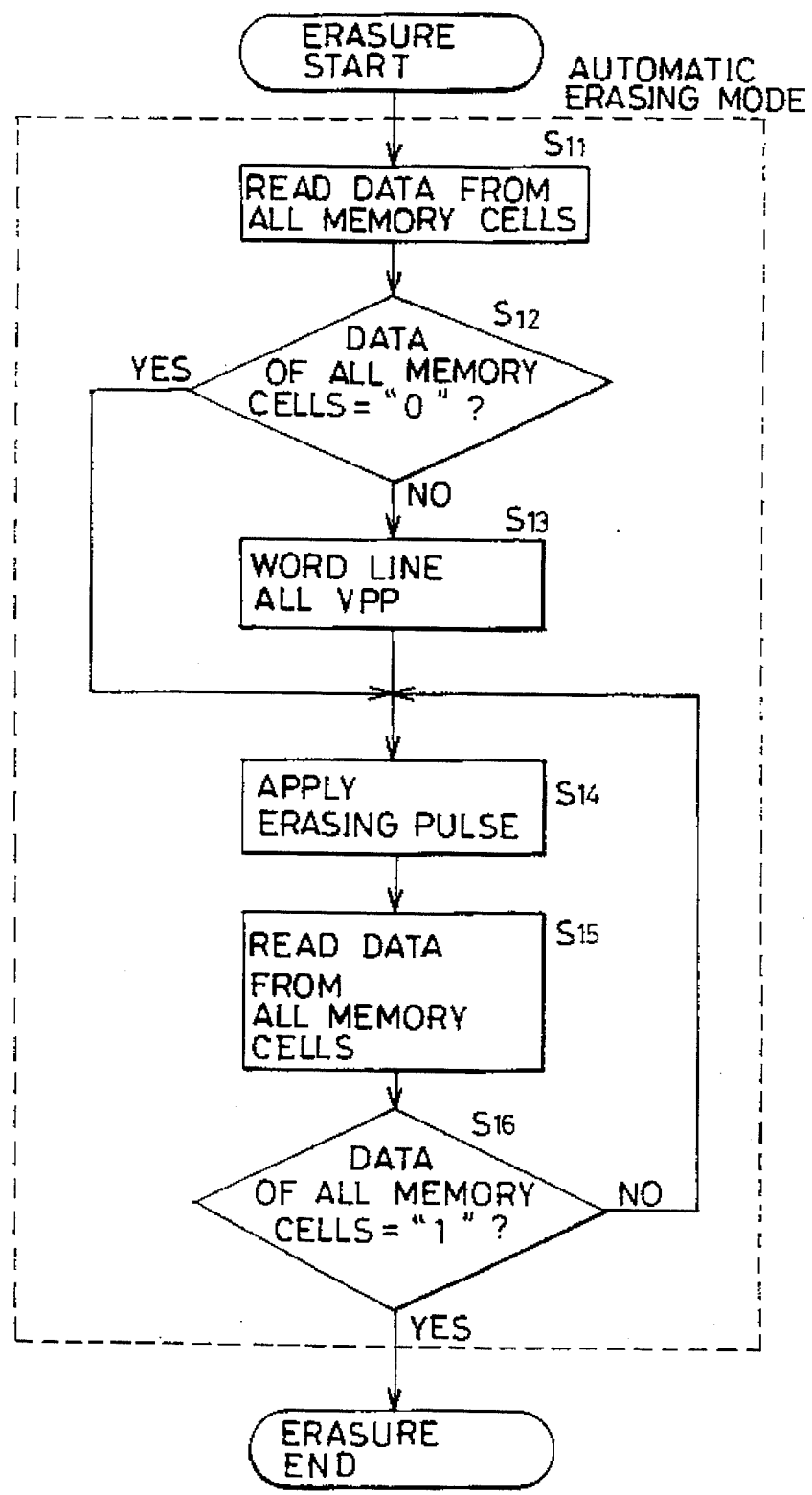
FIG. 6 is a flow chart showing erasing operation of the memory device of FIG. 5.

Since the writing and reading operations are also the same as the conventional example in the present embodiment, the erasing operation will be mainly described in the following with reference to the flow chart of FIG. 6.

When a control signal enabling the automatic erasing mode is inputted to the control signal buffer 20, the automatic erasing control circuit 26 detects the input and erasing operation is started. First, in the step S11, the address counter 34 generates an address in response to a signal outputted from the automatic erasing control circuit 26, and this address is input to the address buffer 7 by the switching circuit 36. By successively changing the addresses, data are read from all the memory cells. If the data of all memory cells are not "0" (NO in S12), all the source lines 17 in the memory cell array 14 are set to the "L" level through the array source switch 22 in step S13, and all word lines 16 are activated through the row decoder 9.

At the same time, the erasing pulse generating circuit 25 applies collective writing pulses having the predetermined pulse width to the high voltage control circuit 19, and applies these pulses to the high voltage switch through this circuit. Consequently, high voltage $v_{PP}$ programming pulses are applied to all word lines (S14), writing of the information "0" is carried out on all the memory cells, and the threshold values of all memory transistors are set to the high threshold voltage state.

Then, in step 14, the automatic erasing control circuit 26 sets all the word lines 16 to the "L" level through the row decoder 9, and activates all the source lines 17 through the array source switch 22. At the same time, the erasing pulse generating circuit 25 applies the erasing pulses of the predetermined pulse width to the array source switch 22 through the high voltage control circuit 19. Consequently, all the source lines 17 are set to the high voltage state, and all the memory cells are set to the low threshold value state.

Then, the data of the memory cells of all addresses are read in the step S15, and the erasing operation is repeated until the data of all memory cells are "1". Thus, the erasing operation in this embodiment is completed.

Figure 7:
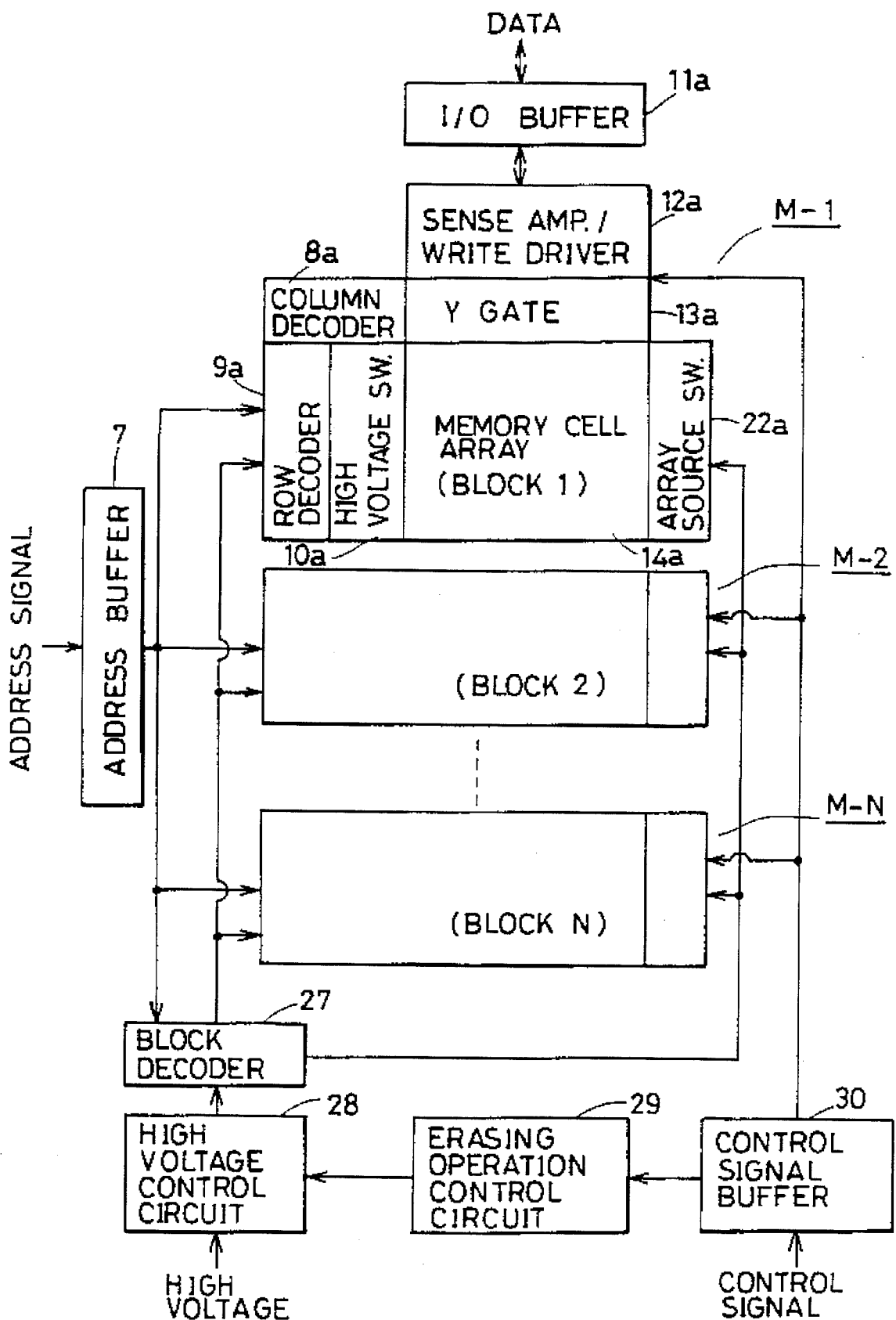
FIG. 7 is a block diagram of a non-volatile semiconductor memory device in accordance with a further embodiment of the present invention.

FIG. 7 shows a further embodiment of the present invention, which is a block diagram of a non-volatile semiconductor memory device in which the memory cell array is divided into blocks.

As shown in the figure, the memory cell array is divided into a plurality of blocks (M-1 to M-N). The column decoder, the row decoder, the high voltage switch and the like provided in the periphery of one memory cell array 14a are the same as those shown in FIG. 1. In this non-volatile semiconductor memory device, when an address signal is inputted to the address buffer 7, the signal is applied to the block decoder 27, a row decoder of a prescribed block is selected, and a prescribed address in the memory cell array of that block is selected. The writing and reading operations in each block are the same as the operations in the above embodiments in which the array is not divided into blocks, so that the description thereof is not repeated. The erasing operation in this embodiment will be mainly described in the following.

When the erasing operation of a prescribed block is started, the high voltage signal outputted from the high voltage control circuit 28 is decoded by a block decoder 27, the high voltage is applied to the high voltage switch and the array source switch of the selected block, and the erasing operation on the memory cells in that block is carried out. The erasing operation in each block is the same as that in the above embodiments. Erasing operation of a desired block can be carried out under control by the block decoder 27.

When collective erasing of all the memory cells of the divided blocks are to be carried out, the outputs from the block decoder 27 are all activated, and the high voltage outputted from the high voltage control circuit 28 is applied to the high voltage switches or the array source switches of all the blocks, whereby collective erasing of all the blocks becomes possible.

Although the erasing operation is carried out under control by the external CPU as in the embodiment of FIG. 1, erasing operation of memory cells in each block or in all the blocks can be carried out by the automatic erasing mode under internal control by employing the structure of FIG. 5.

As described above, in the present invention, electrons are simultaneously introduced to the floating gates of all the memory cells before the start of collective erasing, whereby the time required for the erasing operation can be reduced, the threshold values in the memory cells are the same after the erasing operation, increasing reliability, Further, since introduction of electrons to the floating gates of the memory cells of all addresses is realized by the tunneling phenomenon, the power consumption is as small as not higher than 1 nA per 1 memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a plurality of memory cells each including a floating gate;

injecting means for injecting electrons to the floating gate of each memory cell;

removing means for removing electrons from the floating gate of each memory cell;

erasing instruction means for instructing an erasing operation, said erasing operation including a stage of writing before erasing operation, and a stage of pulse applying and verifying operations for erasing; and controlling means responsive to an instruction output from said erasing instruction means for controlling said injecting means such that electrons are simultaneously injected to all the floating gates of the plurality of memory cells which are to be erased before the removing operation by the removing means, wherein a predetermined voltage is simultaneously applied to all of the plurality of memory cells to be erased in said stage of writing before erasing operation.

2. A non-volatile semiconductor memory device according to clam 1, wherein said injecting means is capable of injecting hot electrons.

3. A non-volatile semiconductor memory device according to claim 2, wherein said removing means is capable of removing electrons based on tunnelling effect.

4. A non-volatile semiconductor memory device according to clam 1, further comprising a semiconductor substrate having a main surface; wherein each memory cell comprises a first impurity region and a second impurity region formed spaced apart by a prescribed distance on the main surface of said semiconductor substrate, a first insulating film formed on a region between said first and second impurity regions and below the floating gates, a second insulating film formed on said floating gates, and a conductor formed on said second insulating film.

5. A non-volatile semiconductor memory device according to claim 4, wherein said first impurity region serves as a source region, said second impurity region serves as a drain region, and said conductor serves as a control electrode.

6. A non-volatile semiconductor memory device according to claim 5, wherein said memory cell comprises a FLASH EEPROM.

7. A non-volatile semiconductor memory device, comprising:
- a plurality of memory cells arranged in a matrix of rows and columns, each having a control gate, a floating gate, a source and a drain, and storing information based on an amount of electrons included in said floating gate;
- a plurality of bit lines each provided corresponding to a row of memory cells and connected to the drain of the corresponding memory cells;
- a plurality of word lines each providing corresponding to a column of memory cells and connected to the control gate of the corresponding memory cells;
- writing means for selecting any of said plurality of word lines by applying a potential, for selecting any of said plurality of bit lines by setting the same at a prescribed potential and for setting to a prescribed state the amount of electrons included in the floating gate of the memory cell corresponding to the intersection between the selected word line and the bit line;
- erasing means for drawing electrons included in the floating gate of each memory cell by setting all of said plurality of word lines to a non-selected state and by applying a prescribed potential to the source of each memory cell;
- instructing means for instructing an erasing operating, said erasing operation including a stage of writing before erasing operation, and a stage of pulse applying and verifying operations for erasing; and
- control means responsive to an instructing output from said instructing means for controlling said writing means such that electrons are simultaneously introduced to all the floating gates of the plurality of memory cells which are to be erased before the erasing operation by said erasing means, wherein
- a predetermined voltage is simultaneously applied to all of the plurality of memory cells to be erased in said stage of writing before erasing operation.

8. A non-volatile semiconductor memory device according to clam 7, further comprising;
- reading means for selecting any of said plurality of word lines to set the same at a prescribed potential and selecting any of said plurality of bit lines to set the same to a prescribed potential, for detecting the state of the amount of electrons included in the floating gate of the memory cell at the intersection between the selected word line and the bit line.

9. A non-volatile semiconductor memory device according to claim 7, wherein
said control means is activated based on an externally applied signal.

10. A non-volatile semiconductor memory device according to clam 9, wherein
said control means includes a high voltage generating circuit for generating a high voltage, the high voltage generated in response to an instruction output from said instructing means and being applied to all of said plurality of word lines.

11. A non-volatile semiconductor memory device according to claim 7, wherein
said writing means includes a high voltage generating circuit for applying a high voltage to the selected word line; and
said control means includes an erasing pulse generating circuit for outputting erasing pulses of a prescribed pulse width to said high voltage generating circuit in response to the instruction output from said instructing means, and controls said writing means such that the high voltage is applied to all of said word lines in response to said outputted erasing pulses.

12. A non-volatile semiconductor memory device according to claim 7, wherein
said control means sets the potential of the source of the memory cell to which writing is carried out to 0 V when said writing means is activated, and applies the high voltage to the source of the memory cell to which erasing is carried out when said output means is activated.

13. A non-volatile semiconductor memory device formed of a plurality of memory blocks, wherein
each memory cell array block comprises:
- a plurality of memory cells arranged in a matrix of rows and columns, each having a control gate, a floating gate, a source and a drain, and storing information based on an amount of electrons included in said floating gate;
- a plurality of bit lines each provided corresponding to the drain of the corresponding memory cells;
- a plurality of word lines each providing connected to the control gate of the corresponding memory cells;
- writing means for selecting any of said plurality of word lines by applying a potential, for selecting any of said plurality of bit lines by setting the same to a prescribed potential and for setting the amount of electors included in the floating gate of the memory cell corresponding to the intersection of the selected word line and the bit line to a prescribed state; and
- erasing means for drawing electrons included in the floating gate of each memory cell by setting all of said plurality of word lines to a non-selected state and by applying a prescribed potential to the source of each memory cell;

said non-volatile semiconductor memory device comprising
- instructing means for instructing an erasing operation, said erasing operation including a stage of writing before erasing operation, and a stage of pulse applying and verifying operations for erasing and
- control means responsive to an instructing output from said instructing means, for controlling, before activating the erasing operation included in a prescribed memory block, said writing means included in said prescribed memory cell block such that electrons are simultaneously injected to all of the floating gates of the memory cells to be erased included in said prescribed memory block, wherein
- a predetermined voltage is simultaneously applied to all of the plurality of memory cells to be erased in said stage of writing before erasing operation.

14. A non-volatile semiconductor memory device according to claim 13, further comprising:
- block designating means for designating any of said memory cell array blocks; wherein
- said controlling means includes a high voltage generating circuit for generating a high voltage and, responsive to a designation output from said block designating means, applies said generated high voltage to all of the word lines included in the designated memory cell array block.

15. A non-volatile semiconductor memory device according to claim 14, wherein said control means is activated based on an externally applied signal.

16. A method of erasing information in an electrically readable and writable non-volatile semiconductor memory device, comprising the steps of:

changing an amount of electrons in a floating gate of each of a plurality of memory cells;

injecting electrons simultaneously to all the floating gate of said plurality of memory cells, and removing electrons from the floating gate of each of said memory cells, the method of erasing information including a stage of writing before erasing, and a stage of pulse applying and verifying for erasing, wherein a predetermined voltage is simultaneously applied to all of the plurality of memory cells to be erased in said stage of writing before erasing.

17. A method of erasing according to claim 16, wherein electrons are injected based on tunnel phenomenon in said step of injecting.

18. A method of erasing according to claim 16, wherein electrons are removed based on tunnel phenomenon in said step of removing.

19. A non-volatile semiconductor memory device, comprising:

a plurality of memory cells each having source and drain regions and a floating gate electrode;

injecting means for injecting electrons to the floating gate electrode of each memory cell;

removing means for removing electrons from the floating gate electrode of each memory cell; and erasing means for collectively erasing contents of said plurality of memory cells, comprising means for controlling said injecting means to inject electrons to the floating gate electrodes of said plurality of memory cells simultaneously, and then controlling said removing means to remove electrons from the floating gate electrodes of said plurality of memory cells, the erasing including a stage of writing before erasing operation and a stage of pulse applying and verifying for erasing operation, wherein a predetermined voltage is simultaneously applied to all of the plurality of memory cells to be erased in said stage of writing before erasing.

20. A non-volatile semiconductor memory device according to claim 19, wherein said erasing means includes means for controlling said removing means to remove electrons from the gate electrodes of said plurality of memory cells simultaneously.

21. A non-volatile semiconductor memory device according to claim 19, wherein said injecting means includes means responsive to the erasing of said erasing means for injecting electrons into said gate electrodes by tunnelling.

22. A non-volatile semiconductor memory device according to claim 21, wherein said injecting means includes means for applying a first potential to source and drain electrodes and a second potential, more positive than the first potential, to the floating gate electrodes of said plurality of memory cells.

23. A non-volatile semiconductor memory device according to claim 19, wherein said injecting means includes means, during normal programming, for injecting electron into said gate electrode by a hot electron effect.

24. A non-volatile semiconductor memory device according to claim 23, wherein said injecting means includes means for applying a first potential to source and drain electrodes and a second potential to the floating gate electrodes of said plurality of memory cells.

25. A non-volatile semiconductor memory device formed of a plurality of memory cell array blocks, wherein each memory cell array block comprises:

a plurality of memory cells each having source and drain regions and a floating gate electrode;

injecting means for injecting electrons to the floating gate electrode of each memory cell; and removing means for removing electrons from the floating gate electrode of each memory cell;

said non-volatile semiconductor memory device comprising erasing means for collectively erasing contents of the plurality of memory cells included in a prescribed memory cell block, including means for controlling said injecting means included in said prescribed memory cell block to inject electrons to the floating gate electrodes of the memory cells simultaneously, and then controlling said removing means included in said prescribed memory cell block to remove electrons from the floating gate electrodes of the memory cells, the erasing including a stage of writing before erasing operation and a stage of pulse applying and verifying for erasing operation, wherein a predetermined voltage is simultaneously applied to all of the plurality of memory cells to be erased in said stage of writing before erasing.

26. A method of operating a non-volatile semiconductor memory device, comprising a plurality of memory cells arranged in a matrix of rows and columns, each memory cell having a control gate, a floating gate, a source and a drain, and storing information based on an amount of electrons included in said floating gate, a plurality of bit lines each provided corresponding to a column of said plurality of memory cells, connected to the drain of the corresponding memory cells, and a plurality of word lines each provided corresponding to the control gate of the corresponding memory cells, said method comprising the steps of writing by applying a potential to a selected word line and applying a prescribed potential to a selected bit line crossing said selected word line and setting to a prescribed state the amount of electrons included in the floating gate of a memory cell corresponding to said crossing;

reading by applying a potential to a word line and reading an output state of said selected cell from a bit line crossing a selected cell; and erasing by first writing to said memory cells so that electrons are injected simultaneously to all said floating gates, and then removing electrons from said floating gates by setting all of said word lines to a non-selected state and applying a prescribed potential to the source of each of said memory cells, the step of erasing information including a stage of writing before erasing, and a stage of pulse applying and verifying for erasing, wherein a predetermined voltage is simultaneously applied to all of the plurality of memory cells to be erased in said stage of writing before erasing.

* * * * *